United States Patent [19]

Pelgrom et al.

[11] Patent Number: 5,311,085

[45] Date of Patent: May 10, 1994

[54] CLOCKED COMPARATOR WITH OFFSET-VOLTAGE COMPENSATION

[75] Inventors: Marcellinus J. M. Pelgrom; Antonia C. Van Rens, both of Eindhoven, Netherlands

[73] Assignee: U.S. Philips Corporation, New York, N.Y.

[21] Appl. No.: 867,594

[22] Filed: Apr. 13, 1992

[30] Foreign Application Priority Data

Apr. 15, 1991 [EP] European Pat. Off. ........ 91200888.5

[51] Int. Cl.$^5$ ............................................. H03K 5/24
[52] U.S. Cl. .................................. 307/494; 307/352; 307/354; 307/491; 330/253
[58] Field of Search .............. 307/494, 354, 353, 352, 307/279, 272.1, 272.2, 270, 491; 330/253

[56] References Cited

U.S. PATENT DOCUMENTS

| | | | |
|---|---|---|---|
| 4,553,052 | 11/1985 | Takahashi | 307/494 |
| 4,748,346 | 5/1988 | Emori | 307/270 |
| 5,047,666 | 9/1991 | Astegher et al. | 307/353 |
| 5,170,079 | 12/1992 | Komatsu et al. | 307/272.1 |

FOREIGN PATENT DOCUMENTS 059111 8/1988 Japan.
100810 9/1988 Japan.

*Primary Examiner*—John S. Heyman
*Assistant Examiner*—My Trang
*Attorney, Agent, or Firm*—Bernard Franzblau

[57] ABSTRACT

A clocked comparator circuit comprises an input stage and a sample-and-hold circuit and an amplifier-latch circuit coupled to the output of the input stage. The sample-and-hold circuit provides an accurate offset-voltage compensation and the amplifier-latch circuit provides a high operating speed by means of a switchable current source (S), T11). Switches are provided so that the amplifier-latch circuit constitutes a differential load having a high positive impedance during a first state of a clock signal, a low positive impedance during a next state of the clock signal, and a negative impedance during a following state of the clock signal.

17 Claims, 2 Drawing Sheets

CLOCKED COMPARATOR WITH OFFSET-VOLTAGE COMPENSATION

BACKGROUND OF THE INVENTION

This invention relates to a comparator circuit for converting a voltage difference appearing between a first and a second input terminal of the comparator circuit during a first state of a clock signal into a voltage difference appearing between a first and a second output terminal during a second state of the clock signal. The comparator circuit comprises an input differential amplifier having a non-inverting input and an inverting input and having an inverting output and a non-inverting output, which outputs are coupled respectively to the first and the second output terminal of the comparator circuit. First switching means apply the voltage difference appearing between the first and the second input terminal during the first state of the clock signal to the non-inverting input and the inverting input respectively. A first and a second capacitor are coupled respectively between the inverting output and a first node and between the non-inverting output and a second node.

Such a comparator circuit can be used inter alia in an analog to digital converter.

A comparator circuit of this type is known from U.S. Pat. No. 4,553,052. In a first state of the clock signal a differential amplifier and a comparator determine whether an input signal is larger or smaller than a certain reference signal. In a second state of the clock signal a decision is made whether an output signal of the differential amplifier is to be transferred to a latch circuit. A resolution realised by an analog to digital converter depends, inter alia, on the accuracy with which the comparators used in the converter can discriminate between the input signal and the reference signal. The accuracy is limited, inter alia by an offset voltage appearing between the inputs of the differential amplifier. One possibility of improving the accuracy of the comparators is to reduce the offset voltage of the differential amplifier. In the known comparator circuit an offset reduction is achieved in that in the first state of the clock signal a voltage difference amplified by the differential amplifier and appearing between the input terminals of the comparator circuit plus the equally amplified offset voltage is stored in capacitors arranged between a reference voltage and the outputs of the differential amplifier. Subsequently, in the second state of the clock signal the inputs of the differential amplifier are interconnected, so that only the offset voltage of the differential amplifier is amplified, the capacitors being connected between the outputs of the differential amplifier and the output terminals of the comparator circuit respectively. Addition of the charge of the capacitors results in a voltage difference across the output terminals which is independent of the offset voltage of the differential amplifier. This voltage difference controls the latch circuit, which latch circuit consequently indicates at its output terminal which of the two outputs of the differential amplifier carries the higher voltage. In these circuits it is essential that the voltage difference to be detected and appearing on the capacitors is maintained in order to preserve the information about this voltage difference during the transition from the first state of the clock signal to the second state of the clock signal. In the known comparator circuit the capacitors are charged in the first state of the clock signal and are isolated from their charging path in the second state of the clock signal. This isolation from the charging path is effected by means of MOS transistors, which usually results in differences of the injected channel charge owing to the spread in area and threshold voltage of the MOS transistors. These differences constitute the limiting factor in the design of comparator circuits.

SUMMARY OF THE INVENTION

It is an object of the invention to provide an accurate clocked comparator circuit which mitigates the above problems.

To this end a comparator circuit of the type defined in the opening paragraph is characterised in that the capacitors form a part of a sample-and-hold circuit coupled to the inverting output and the non-inverting input of the output differential amplifier, an amplifier-latch circuit being coupled to the inverting output and the non-inverting output of the input differential amplifier. In the comparator circuit in accordance with the invention the difference between the voltages on the inverting input and the non-inverting input of the differential amplifier is stored by means of said sample-and-hold circuit. The result is that the desired voltage difference is still available very precisely during the subsequent subtract and latch cycle in the second state of the clock signal. An advantage of this circuit is that it can be isolated from the common supply lines and from the input voltage. Indeed, during their latching actions the comparator circuits which operate rapidly as a result of strong input signals often produce switching pulses on these supply lines, thereby seriously distributing the subtract and latching actions of other comparator circuits operating more slowly as a result of smaller signals on their inputs.

A first embodiment of the comparator circuit in accordance with the invention may be characterised in that the sample-and-hold circuit comprises a differential amplifier having a first input coupled to the first capacitor and having a second input coupled to the second capacitor, said first and said second input being coupled to the inverting and the non-inverting output of the input differential amplifier via second and third switching means respectively. This circuit has the advantage that its implementation is fully differential and that it very accurately retains the amplified voltage difference on the outputs of the differential amplifier.

A second embodiment of the comparator circuit in accordance with the invention may be characterised in that the first and the second output of the differential amplifier of the sample-and-hold circuit are respectively coupled to the inverting and the non-inverting output of the input differential amplifier.

A third embodiment of the comparator circuit in accordance with the invention may be characterised in that the first and the second node are the same and the comparator circuit is adapted to couple a reference voltage to both the inverting input and the non-inverting input of the input differential amplifier during the second state of the clock signal by means of fourth switching means.

A fourth embodiment of the comparator circuit in accordance with the invention may be characterised in that the amplifier-latch circuit comprises two diode-connected transistors coupled to a current source via fifth switching means and to a further current source via sixth switching means.

BRIEF DESCRIPTION OF THE DRAWINGS

Embodiments of the invention will now be described in more detail with reference to the drawings, in which.

DESCRIPTION OF THE PREFERRED EMBODIMENTS

Figure 1:
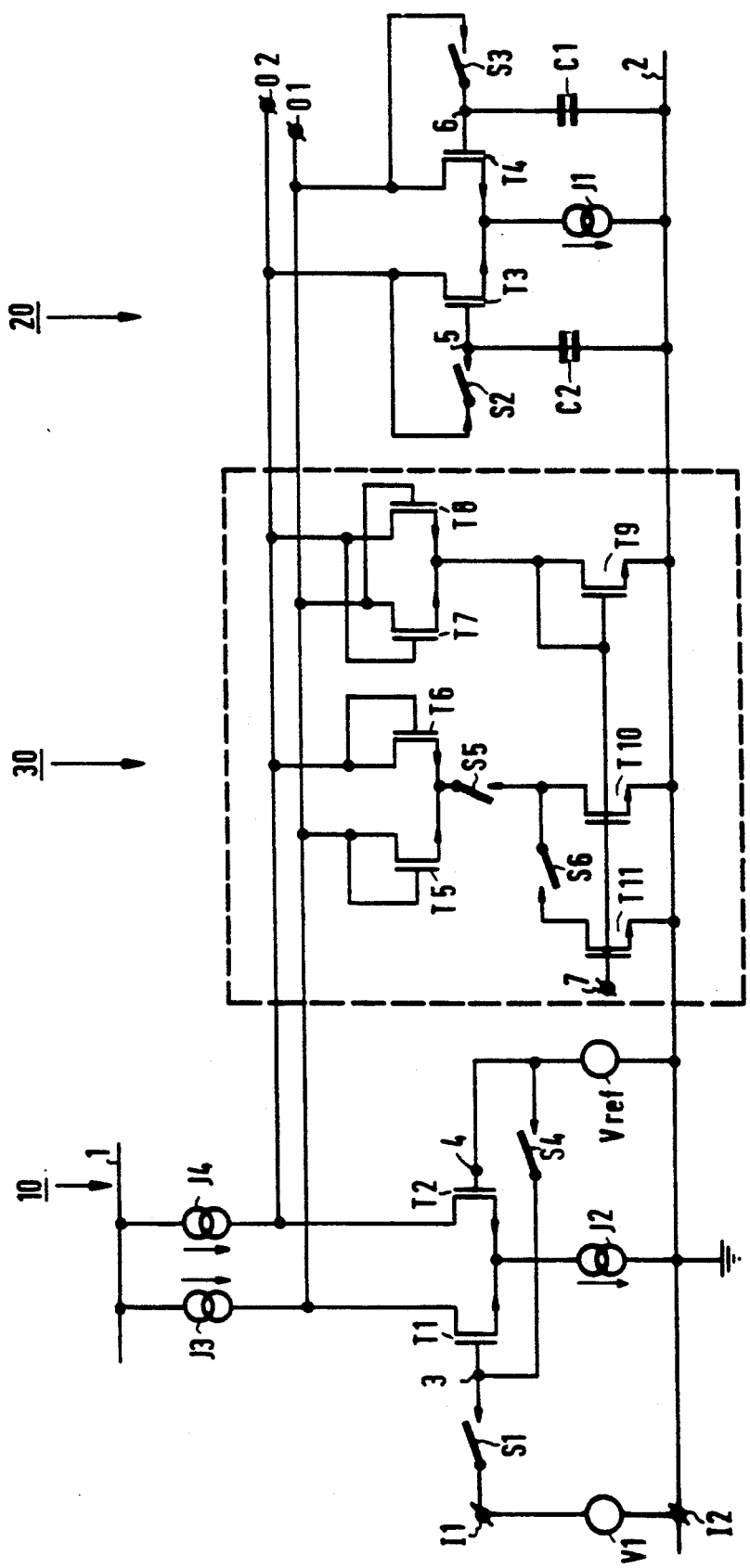
FIG. 1 shows a clocked comparator circuit in accordance with the invention.

FIG. 1 shows a clocked comparator circuit in accordance with the invention which is connected between two supply rails 1 and 2. The comparator circuit in accordance with the invention comprises an input stage 10, a sample-and-hold circuit 20, and an amplifier-latch circuit 30. The input stage 10 comprises a differential amplifier with two transistors T1 and T2, having their sources connected to the supply rail 2 via a current source J2 and having their drains connected to the supply rail 1 via a current source J3 and J4 respectively. A node 3, to which the gate of the transistor T1 is connected, is connected to a non-inverting input terminal I1 of the comparator circuit via first switching means S1, which can take the form of a MOS-FET switch, to which non-inverting input terminal a voltage source V1 can be connected. A terminal I2 connected to the supply rail 2 constitutes the inverting input terminal of the comparator circuit. A reference voltage source Vref is arranged between a node 4, to which the gate of the transistor T2 is connected, and the supply rail 2. Moreover, the node 4 can be connected to the node 3 via fourth switching means S4, the fourth switching means S4 operating in phase opposition to the first switching means S1. The drains of the transistors T1 and T2 respectively constitute an inverting output terminal O1 and a non-inverting output terminal O2 of the comparator circuit.

The sample-and-hold circuit 20 comprises a differential amplifier with two transistors T3 and T4 whose sources are connected to the supply rail 2 via a current source J1. The gate of the transistor T4 is a first input of the sample-and-hold circuit and is connected to a capacitor C1 and to switching means S3 via a node 6, which switching means can connect the gate to the drain of the transistor T4. The gate of the transistor T3 is a second input of the sample-and-hold circuit and is connected to a capacitor C2 via a node 5 and to second switching means S2, which can connect the gate of the transistor T3 to its drain. The switching means S2 and S3 operate in phase with the switching means S1. The drains of the transistors T4 and T3 are connected to the inverting and the non-inverting output terminals O1 and O2, respectively.

The amplifier-latch circuit 30 comprises two diode-connected transistors T5 and T6 in its amplifier section, which transistors have their gates connected to the output terminals O1 and O2. The sources of the transistors T5 and T6 are connected to a transistor T10 via switching means S5. The transistor T10 has its source connected to the supply rail 2. The drain of the transistor T10 is connected to the drain of the further transistor T11 via switching means S6, which further transistor also has its source connected to the supply rail 2. The gates of the transistors T10 and T11 are interconnected and are connected to a terminal 7 carrying a fixed control voltage. A latch section of the amplifier-latch circuit 30 comprises two cross-coupled transistors T7 and T8 having their gates connected to the output terminals O1 and O2. The sources of the transistors T7 and T8 are connected to the supply rail 2 via a diode-connected transistor T9. The gate of the transistor T9 is connected to the gates of the transistors T10 and T11.

The comparator circuit with offset compensation shown in FIG. 1 operates as follows. During a signal-sampling cycle the switching means S1, S2, S3 and S5 are closed. The cross-coupled transistors T7 and T8 in the latch circuit 30 and the transistors T5 and T6 in the amplifier circuit have been designed to provide a comparatively high impedance. The input signal V1 amplified via the input stage 10 appears on the output terminals O1 and O2 and is stored in the capacitors C1 and C2. Subsequently, the switching means S1, S2, S3 are opened and the switching means S4 is closed. The voltage difference between the nodes 5 and 6 on the capacitors C2 and C1 is directly proportional to the voltage difference Vin-Vref applied to the input differential amplifier (T1, T2). The offset voltage may be amplified by the closure of the switching means S4. Simultaneously with the closure of the switching means S4 the switching means S6 are closed, which activates an additional current source in the form of the transistor T11 in the amplifier section of the amplifier-latch circuit 30, resulting in a well-defined positive impedance. The current difference from the input differential amplifier (T1, T2) now corresponds to the offset errors at the input and the current difference from the sample-and-hold circuit 20 corresponds to the input signal Vin minus the reference voltage Vref including the above-mentioned offset errors. As a result of this, the residual current difference in the amplifier-latch circuit corresponds to only the input signal Vin minus the reference voltage Vref. If, subsequently the fifth switching means S5 is opened the latch circuit comprising the transistors T7 and T8 can take over and latch the resulting voltage difference on the output terminals O1 and O2, after which the information on the output terminals O1 and O2 can be transferred to a decoder network.

Figure 2:
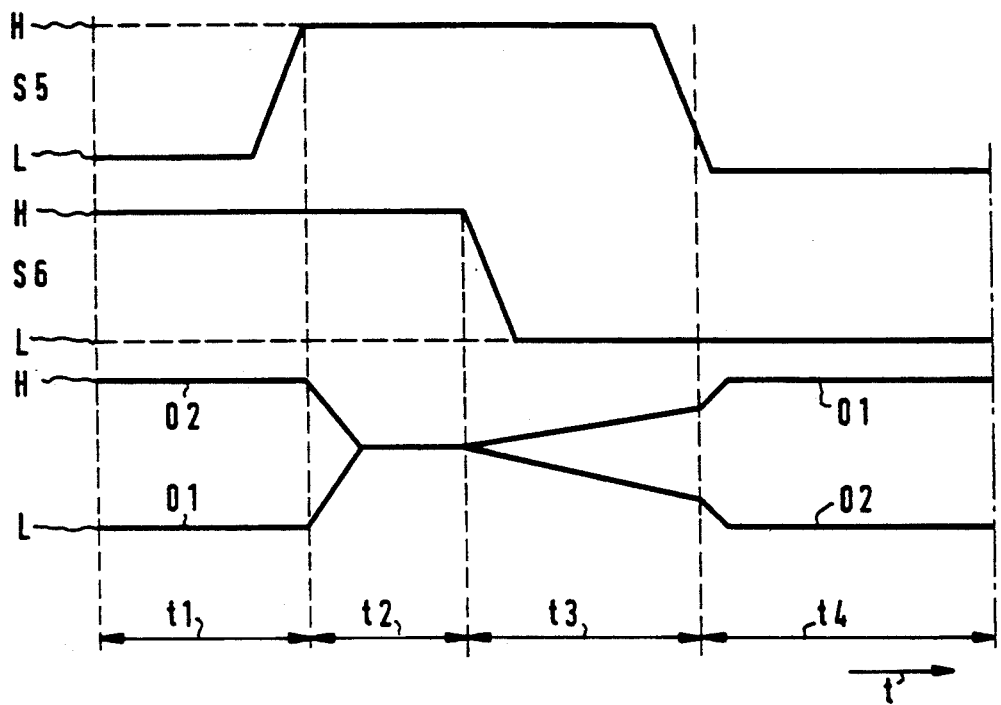
FIG. 2 is a time diagram illustrating the operation of the amplifier-latch circuit.

FIG. 2 shows a time diagram of the various signals appearing in the amplifier-latch circuit 30. FIG. 2 shows from top to bottom the state of the switching means S5 and S6 and the voltages on the outputs O2 and O1. During an interval t1 the switching means S5 are open and the amplifier-latch circuit 30 is in the latch mode. The switching means S6 are then closed. The voltages on the output terminals O1 and O2 assume, for example, a low state and a high state respectively. At the transistion from the interval t1 and t2 the switching means S5 are closed and the switching means S6 remain closed. During this interval t2 a comparatively large current can flow through the transistors T5 and T6, so that a discharge current flows from the output terminal O2 and the output terminals O1 and O2 assume the same voltage level. At the transition from the interval t2 to t3 the switching means S6 are opened, so that voltages as described above develop on the output terminals O1 and O2 during the interval t3. At the transistion from the interval t2 to t3 the switching means S6 are opened, causing voltages to develop on the output terminals O1 and O2 during the interval t3, as described hereinbefore. At the transition from the interval t3 to t4 the switching means S5 are opened, so that subsequently the latch circuit comprising the transistors T7 and T8 can take over the voltages developed on the output terminals O1 and O2.

In the above description it is assumed that the input stage is constituted by a differential pair which drives the sample-and-hold circuit. Another type of operation is possible with comparators having an internal sample-and-hold circuit which is used for sampling the input signal or storing the offset. In that case the control pulses controlling the switching means S6 can be used for isolating the comparators from the combined differential amplifier and sample-and-hold circuit by switching these to a state of high impedance. However, during a last part of the clock pulse controlling the switch S6 the amplifier-latch circuit should then be set to a mode in which the signal formed by the combination of the differential amplifier and sample-and-hold circuit is amplified in a well-defined manner.

We claim:

1. A comparator circuit for converting a voltage difference appearing between a first and a second input terminal of the comparator circuit during a first state of a clock signal into a voltage difference appearing between a first and a second output terminal during a second state of the clock signal, the comparator circuit comprising: an input differential amplifier having a non-inverting input and an inverting input and having an inverting output and a non-inverting output coupled respectively to the first and the second output terminal of the comparator circuit, first switching means for coupling a voltage difference appearing between the first and the second input terminal during the first state of the clock signal to the non-inverting input and the inverting input respectively, a sample-and-hold circuit coupled to the inverting output and the non-inverting output of the input differential amplifier and comprising a further differential amplifier having a first input coupled to a first capacitor and a second input coupled to a second capacitor, and means coupling an amplifier-latch circuit to the inverting output and the non-inverting output of the input differential amplifier, the amplifier-latch circuit comprising a first pair of diode-connected transistors coupled between a first common node and the inverting output and the non-inverting output of the input differential amplifier, a second pair of cross-coupled transistors coupled between a second common node and the inverting output and the non-inverting output of the input differential amplifier, a current-mirror with a switchable current transfer having an input terminal coupled to the second common node and an output terminal, and further switching means for coupling the output terminal of the current-mirror to the first common node during the first and a third state of the clock signal and for switching the current transfer of the current mirror from a first transfer value to a second transfer value during at least the third state of the clock signal, wherein the third state of the clock signal occurs between the first and second clock signal states.

2. A comparator circuit as claimed in claim 1, wherein the first and second input of the further differential amplifier are coupled to the inverting and the non-inverting output of the input differential amplifier via second and third switching means, respectively, during the first state of the clock signal.

3. A comparator circuit as claimed in claim 2, wherein a first and a second output of the further differential amplifier of the sample-and-hold circuit are respectively coupled to the inverting and the non-inverting output of the input differential amplifier.

4. A comparator circuit as claimed in claim 3, further comprising fourth switching means for coupling a reference voltage to both the inverting input and the non-inverting input of the input differential amplifier during the third state of the clock signal.

5. A comparator circuit as claimed in claim 2, further comprising fourth switching means for coupling a reference voltage to both the inverting input and the non-inverting input of the input differential amplifier during the third state of the clock signal.

6. A comparator circuit as claimed in claim 1, wherein a reference voltage is coupled to both the inverting input and the non-inverting input of the input differential amplifier during the third state of the clock signal by means of a switching device.

7. A clocked comparator circuit for converting an input voltage at a first and a second input terminal during a first state of a clock signal into an output voltage appearing between a first and a second output terminal of the comparator circuit during a second state of the clock signal, the comparator circuit comprising: an input differential amplifier having a first input and a second input and having a first output and a second output coupled respectively to the first and the second output terminal of the comparator circuit, first switching means for coupling an input voltage appearing between the first and the second input terminal to the first and second input, respectively, of the input differential amplifier during the first state of the clock signal, a sample-and-hold circuit comprising a further differential amplifier having a first input coupled to a first capacitor and a second input coupled to a second capacitor and second and third switching means for coupling said first and second input of the further differential amplifier to the first and second outputs of the input differential amplifier during the first state of the clock signal, and an amplifier-latch circuit coupled to the first and second outputs of the input differential amplifier, and wherein the amplifier-latch circuit comprises two diode-connected transistors coupled to a current source via fourth switching means and to a further current source via fifth switching means.

8. A comparator circuit as claimed in claim 7 further comprising sixth switching means for coupling a reference voltage to both the first input and the second input of the input differential amplifier during a third state of the clock signal, wherein said third state follows the first state and precedes the second state of the clock signal.

9. A comparator circuit as claimed in claim 7 further comprising a current mirror including the current source and the further current source of the amplifier-latch circuit, and the amplifier-latch circuit further comprises a pair of cross-coupled transistors coupled to the current mirror circuit and the first and second outputs of the input differential amplifier.

10. A comparator circuit for converting, during a first state of a clock signal, an input voltage at a first and a second input terminal into an output voltage appearing between a first and a second output terminal of the comparator circuit during a second state of the clock signal, the comparator circuit comprising:

an input differential amplifier having a first input and a second input and having a first output and a second output coupled respectively to the first and the second output terminal of the comparator circuit, first switching means for coupling an input voltage appearing between the first and the second input terminal to the first and second input, respectively, of the input differential amplifier, a sample-and-hold circuit comprising a further differential amplifier coupled to first and second capacitors, an amplifier-latch circuit coupled to the first and second outputs of the input differential amplifier to form a load, and further switching means controlled by the clock signal so that the amplifier-latch circuit constitutes a load having a high positive impedance during the first state of the clock signal, a negative impedance during the second state of the clock signal, and a low positive impedance during a third state of the clock signal that occurs between the first and second states of the clock signal.

11. A comparator circuit as claimed in claim 10 wherein the amplifier-latch circuit further comprises two diode-connected transistors coupled to a first current source via a second switching means and to a further current source via a third switching means, wherein said second and third switching means comprise said further switching means.

12. A comparator circuit as claimed in claim 11 further comprising a reference voltage coupled to the first and second inputs of the input differential amplifier during the third state of the clock signal via a fourth switching means.

13. A comparator circuit as claimed in claim 10 further comprising a reference voltage coupled to the first and second inputs of the input differential amplifier during the third state of the clock signal via a second switching means.

14. A comparator circuit as claimed in 11 further comprising a current mirror including the current source and the further current source of the amplifier-latch circuit, and the amplifier-latch circuit further comprises a pair of cross-coupled transistors coupled to the current mirror circuit and the first and second outputs of the input differential amplifier.

15. A comparator circuit as claimed in claim 10 wherein the amplifier-latch circuit further comprises a pair of diode-connected transistors coupled in series with a second switching means and a current source between the first and second outputs of the input differential amplifier and a circuit node, and a third switching means for coupling said pair of diode-connected transistors to the circuit node via a second current source, wherein said second and third switching means comprise said further switching means.

16. A comparator circuit as claimed in claim 10 wherein the input differential amplifier further comprises first and second transistors coupled to a first terminal of a source of supply voltage via first and second current sources, respectively, and further connected in common via a third current source to a second terminal of said source of supply voltage.

17. A comparator circuit as claimed in claim 11 wherein during the first state of the clock signal the second switching means is closed and the third switching means is open, during the second state of the clock signal the second switching means is open and during the third state of the clock signal the second and third switching means are both closed.

* * * * *